United States Patent
Chen et al.

(10) Patent No.: US 12,289,637 B2
(45) Date of Patent: *Apr. 29, 2025

(54) BUFFER CONTROL METHOD AND USER EQUIPMENT

(71) Applicants: China Mobile Communication Co., Ltd Research Institute, Beijing (CN); China Mobile Communications Group Co., Ltd., Beijing (CN)

(72) Inventors: Ningyu Chen, Beijing (CN); Nan Hu, Beijing (CN)

(73) Assignees: China Mobile Communication Co., Ltd Research Institute, Beijing (CN); China Mobile Communications Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/297,092

(22) Filed: Apr. 7, 2023

(65) Prior Publication Data
US 2023/0247481 A1    Aug. 3, 2023

Related U.S. Application Data (63) Continuation of application No. 16/767,159, filed as application No. PCT/CN2018/117415 on Nov. 26, 2018, now Pat. No. 11,627,491.

(30) Foreign Application Priority Data

Nov. 28, 2017    (CN) .......................... 201711215247.5

(51) Int. Cl.
*H04W 76/27*    (2018.01)
*H04W 8/24*    (2009.01)
(Continued)

(52) U.S. Cl.
CPC ............. *H04W 28/06* (2013.01); *H04W 8/24* (2013.01); *H04W 28/0278* (2013.01); *H04W 76/27* (2018.02); *H04W 80/08* (2013.01)

(58) Field of Classification Search
CPC ....... H04W 28/06; H04W 76/27; H04W 8/24; H04W 28/0278; H04W 80/08;
(Continued)

(56) References Cited

U.S. PATENT DOCUMENTS

2015/0085835 A1*    3/2015    Eravelli ................. H04L 69/04
                                                                370/336
2016/0142518 A1    5/2016    Raina et al.
(Continued)

FOREIGN PATENT DOCUMENTS

CN    103457609 A    12/2013
CN    105556924 A    5/2016
(Continued)

OTHER PUBLICATIONS

Discussion on UDC Checksum Error Handling and Message Formats; R2-1713904; 3GPP TSG-RAN WG2 #100 Reno, Nevada, USA, Nov. 27-Dec. 1, 2017, 3 pages.
(Continued)

*Primary Examiner* — Lakeram Jangbahadur
(74) *Attorney, Agent, or Firm* — Price Heneveld LLP (57) ABSTRACT

A buffer control method, a UE, and a non-volatile computer-readable storage medium are provided. The buffer control method for the UE includes: transmitting, by the UE, first check information to a network side device; receiving, by the UE, first buffer resetting information from the network side device; releasing or emptying a current compression buffer of the UE in accordance with content in the first buffer resetting information; and when the UE receives a dictionary activating or enabling indication: storing, by the UE, a
(Continued)

dictionary into the compression buffer; compressing, by the UE through UDC, an uncompressed data packet to obtain a compressed data packet; and transmitting, by the UE, the compressed data packet, wherein the compression buffer is continuously updated by the UE in accordance with the uncompressed data packet.

17 Claims, 5 Drawing Sheets

(51) Int. Cl.
*H04W 28/02* (2009.01)
*H04W 28/06* (2009.01)
*H04W 80/08* (2009.01)

(58) Field of Classification Search
CPC ..... H04W 28/065; H04W 76/10; H04W 8/22; H04W 80/02
See application file for complete search history.

(56) References Cited

U.S. PATENT DOCUMENTS

| | | | |
|---|---|---|---|
| 2016/0142934 A1* | 5/2016 | Ahmadzadeh | H04W 28/06 370/328 |
| 2019/0124181 A1 | 4/2019 | Park et al. | |
| 2019/0141567 A1* | 5/2019 | Liu | H04L 69/04 |
| 2019/0149421 A1 | 5/2019 | Jin et al. | |
| 2019/0349822 A1 | 11/2019 | Kim et al. | |
| 2020/0296623 A1* | 9/2020 | Shreevastav | H04L 69/22 |
| 2020/0351712 A1 | 11/2020 | Kim | |

FOREIGN PATENT DOCUMENTS

| | | |
|---|---|---|
| CN | 107302585 A | 10/2017 |
| EP | 3244677 A1 | 11/2017 |

OTHER PUBLICATIONS

CATT: "Consideration on Signalling and Procedures for UDC", 3GPP Draft; R2-1710721, 3rd Generation Partnership Project (3GPP), Mobile Competence Centre; 650, Route Des Lucioles; F-06921 Sophia-Antipolis Cedex; France; vol. RAN WG2, No. Prague, Czech Republic; Oct. 9, 2017-Oct. 13, 2017 Oct. 8, 2017 (Oct. 8, 2017), XP051342749, Retrieved from the Internet: URL:http://ww3gpp.org/ftp/Meetings_3GPP_SYNC/RAN2/Docs/ [retrieved on Oct. 8, 2017].

Ericsson: "Release and Reset Behaviour for UDC", 3GPP Draft; R2-1713357, 3rd Generation Partnership Project (3GPP), Mobile Competence Centre; 650, Route Des Lucioles; F-06921 Sophia-Antipolis Cedex; France; vol. RAN WG2, No. Reno, USA; Nov. 27, 2017-Dec. 1, 2017 Nov. 16, 2017 (Nov. 16, 2017), XP051371109, Retrieved from the Internet: URL:http://www.3gpp.org/ftp/tsp%5Fran/WG2%FRL2/TSGR2%5F100/Docs/ [retrieved on Nov. 16, 2017].

Huawei et al: "Discussion on checksum failure handling for UDC", 3GPP Daft; R2-1712715 Discussion on Checksum Failure Handling for UDC, 3rd Generation Partnership Project (3GPP), Mobile Competence Centre; 650, Route Des Lucioles; F-06921 Sofia-Antipolis Cedex; vol. RAN WG2, No. Reno, Nevada, SA; Nov. 27, 2017-Dec. 1, 2017 Nov. 17, 2017 (Nov. 17, 2017), XP051371621, Retrieved from the Internet: URL:http://www.3gpp.org/ftp/tsp%5Fran/WG2%5FRL2/TSGR2%5F100/Docs/ [Retrieved on Nov. 17, 2017].

Mediatek Inc: "Summary of email discussion [99bis#29][LTE/UDS]Operator", 3GPP Draft; R2-1713907-Email_Summary_on_99bis#29, 3rd Generationpartnership Project (3GPP), Mobile Competence Centre; 650, Route Des Lucioles; F-06921 Sofphia-Antipolis Cedes; France, vol. RAN WG2, No. Reno, Nevada, USA; Nov. 27, 2017-Dec. 1, 2017 Nov. 17, 2017 (Nov. 17, 2017), XP051372542, Retrieved from the Internet: URL:http://www.3gpp.ort/ftp/tsg%5Fran/WG2%FRL2/TSGR2%5F100/Docs/ [Retrieved on Nov. 17, 2017].

\* cited by examiner

BUFFER CONTROL METHOD AND USER EQUIPMENT

CROSS-REFERENCE TO RELATED APPLICATION

The present application is a continuation of U.S. patent application Ser. No. 16/767,159 filed on May 27, 2020, which is the U.S. national phase of PCT Application No. PCT/CN2018/117415 filed on Nov. 26, 2018, which claims a priority of the Chinese patent application No. 201711215247.5 filed in China on Nov. 28, 2017, each of which is incorporated herein by reference in its entirety.

TECHNICAL FIELD

The present disclosure relates to the field of radio technology, in particular to a buffer control method and a User Equipment (UE).

BACKGROUND

During data transmission, data may be compressed by using a dictionary. Data compression aims to compress a large quantity of to-be-transmitted data into a small quantity of data in accordance with the dictionary, so as to perform the data transmission rapidly and efficiently. A dictionary is pre-stored in a UE, and a same dictionary is pre-stored in a network side device. During the data transmission, the data is compressed by a transmitter using the dictionary, and decompressed by a receiver using the same dictionary.

SUMMARY

An object of the present disclosure is to provide a buffer control method and a UE, so as to enable the network side device to configure a most appropriate dictionary for the UE.

In a first aspect, the present disclosure provides in some embodiments a buffer control method for a UE, including: transmitting, by the UE, first check information to a network side device; receiving, by the UE, first buffer resetting information from the network side device; releasing or emptying a current compression buffer of the UE in accordance with content in the first buffer resetting information; and when the UE receives a dictionary activating or enabling indication: storing, by the UE, a dictionary into the compression buffer; compressing, by the UE through Uplink Data Compression (UDC), an uncompressed data packet to obtain a compressed data packet; and transmitting, by the UE, the compressed data packet, wherein the compression buffer is continuously updated by the UE in accordance with the uncompressed data packet.

In a possible embodiment of the present disclosure, the buffer control method further comprises: continuing to compress, by the UE, a subsequent data packet using the updated compression buffer.

In a possible embodiment of the present disclosure, the buffer control method further includes receiving, by the UE, at least one of UDC activating indication and $M^{th}$ dictionary activating or enabling indication from the network side device, where M is positive integer greater than 1.

In a possible embodiment of the present disclosure, the buffer control method further includes: when the UE receives the UDC activating indication, comparing, by the UE, each PDCP data packet with content in the compression buffer of the UE, and replacing the original PDCP data packet with an identifier of the compression buffer, so as to achieve UDC; and when the UE receives the $M^{th}$ dictionary activating or enabling indication, storing, by the UE, an $M^{th}$ dictionary in the dictionaries previously received and configured by the network side device into the compression buffer, compressing the first PDCP data packet in the current bearer using the $M^{th}$ dictionary, continuously updating the compression buffer in accordance with the transmitted data packets, and continuing to compress the subsequent data packet using the updated compression buffer.

In a possible embodiment of the present disclosure, the buffer control method further includes, when the UE is in a connected state, receiving, by the UE, UDC configuration information from the network side device. The UDC configuration information includes one or more of UDC deactivating indication, UDC dictionary resetting indication and UDC dictionary reloading indication.

In a possible embodiment of the present disclosure, the buffer control method further includes: when the UE receives the UDC deactivating indication, disabling, by the UE, the UDC, and not performing the UDC on a subsequent PDCP data packet; when the UE receives the UDC dictionary resetting indication, emptying, by the UE, the compression buffer; and when the UE receives the UDC dictionary reloading indication, reloading, by the UE, dictionaries into the compression buffer.

In a possible embodiment of the present disclosure, the buffer control method further includes: receiving, by the UE, second check information transmitted by the network side device; determining, by the UE, whether content in a decompression buffer of the UE is identical to content in a compression buffer of the network side device; and when the content in the compression buffer of the network side device is different from the content in the decompression buffer of the UE, transmitting, by the UE, second buffer resetting information to the network side device.

In a possible embodiment of the present disclosure, the second buffer resetting information is used to indicate the network side device to release or empty the compression buffer of the network side device.

In a second aspect, the present disclosure provides in some embodiments a UE, including a processor, a transceiver and a compression buffer. The transceiver is configured to transmit first check information to a network side device, and receive first buffer resetting information from the network side device. The processor is configured to: release or empty the compression buffer of the UE in accordance with content in the first buffer resetting information; and when the transceiver receives a dictionary activating or enabling indication: store a dictionary into the compression buffer; compress an uncompressed data packet through UDC to obtain a compressed data packet; and transmit the compressed data packet, wherein the compression buffer is continuously updated by the processor in accordance with the uncompressed data packet.

In a possible embodiment of the present disclosure, the processor is further configured to continue to compress a subsequent data packet using the updated compression buffer.

In a possible embodiment of the present disclosure, the transceiver is further configured to receive at least one of UDC activating indication and $M^{th}$ dictionary activating or enabling indication from the network side device, where M is positive integer greater than 1.

In a possible embodiment of the present disclosure, the processor is further configured to: when the transceiver receives the UDC activating indication, compare each PDCP data packet with content in the compression buffer of the UE, and replace the original PDCP data packet with an identifier of the compression buffer, so as to achieve UDC; and when the transceiver receives the $M^{th}$ dictionary activating or enabling indication, store an $M^{th}$ dictionary in dictionaries previously received and configured by the network side device into the compression buffer, compress the first PDCP data packet in the current bearer using the $M^{th}$ dictionary, continuously update the compression buffer in accordance with the transmitted data packets, and continue to compress the subsequent data packet using the updated compression buffer.

In a possible embodiment of the present disclosure, the transceiver is further configured to, when the UE is in a connected state, receive UDC configuration information from the network side device, and the UDC configuration information includes one or more of UDC deactivating indication, UDC dictionary resetting indication and UDC dictionary reloading indication.

In a possible embodiment of the present disclosure, the processor is further configured to: when the transceiver receives the UDC deactivating indication, disable the UDC, and not perform UDC on a subsequent PDCP data packet; when the transceiver receives the UDC dictionary resetting indication, empty the compression buffer; and when the transceiver receives the UDC dictionary reloading indication, reload a dictionary into the compression buffer.

In a possible embodiment of the present disclosure, the UE further includes a decompression buffer, the transceiver is further configured to receive second check information transmitted by the network side device, and the processor is further configured to determine whether content in the decompression buffer of the UE is identical to content in a compression buffer of the network side device, and when the content in the decompression buffer of the UE is different from the content in the compression buffer of the network side device, transmit second buffer resetting information to the network side device through the transceiver.

In a possible embodiment of the present disclosure, the second buffer resetting information is used to indicate the network side device to release or empty the compression buffer of the network side device.

In a third aspect, the present disclosure provides in some embodiments a UE, including a memory, a processor, and a computer program stored in the memory and configured to be executed by the processor. The processor is configured to execute the computer program so as to implement the above-mentioned buffer control method in the second aspect.

In a fourth aspect, the present disclosure provides in some embodiments a non-volatile computer-readable storage medium storing therein a computer program. The computer program is configured to be executed by a processor so as to implement the above-mentioned buffer control method in the first aspect or the above-mentioned buffer control method in the second aspect.

The present disclosure has the following beneficial effects. According to the embodiments of the present disclosure, the network side device may dynamically configure for the UE the dictionary for the UDC, and notify the UE to activate, deactivate or reset the dictionary. Then, the UE may perform the UDC in accordance with the dictionary acquired from the network side device. In the solutions of the present disclosure, the UE may perform the UDC using the dictionary dynamically configured by the network side device rather than a pre-stored static dictionary, so it is able for the network side device to configure a most appropriate dictionary for the UE.

DETAILED DESCRIPTION

In order to make the objects, the technical solutions and the advantages of the present disclosure more apparent, the present disclosure will be described hereinafter in conjunction with the drawings and embodiments.

In the related art, a same static dictionary is pre-stored in a UE and a network side device, and data compression and decompression is performed using the static dictionary during the data transmission. When the same static dictionary is used, it is unable to perform the data compression and decompression flexibly. In addition, different dictionaries may be used at different regions in a network and used within different time periods at a same region, so it is difficult to configure a most appropriate dictionary for the UE through the pre-stored static dictionaries.

According to some embodiment of the present disclosure, a dictionary configuration method, a buffer control method, a network side device and a UE are provided, so as to enable the network side device to configure for the UE a most appropriate dictionary for UDC.

Figure 1:
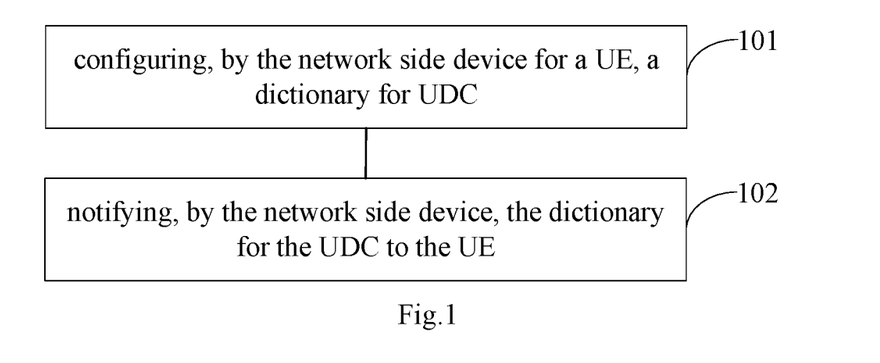
FIG. 1 is a flow chart of a dictionary configuration method for a network side device according to some embodiments of the present disclosure.

The present disclosure provides in some embodiments a dictionary configuration method for a network side device which, as shown in FIG. 1, includes: Step 101 of configuring, by the network side device for a UE, a dictionary for UDC; and Step 102 of notifying, by the network side device, the dictionary for the UDC to the UE.

In the embodiments of the present disclosure, the network side device may dynamically configure for the UE the dictionary for the UDC for the UE, and notify the UE of the dictionary configured by the network side device. Then, the UE may acquire the dictionary for the UDC configured by the network side device for the UE, and perform the UDC in accordance with the acquired dictionary configured by the network side device.

In the embodiments of the present disclosure, the UE may perform the UDC using the dictionary dynamically configured by the network side device rather than a pre-stored static dictionary, so it is able for the network side device to configure a most appropriate dictionary for the UE.

In the embodiments of the present disclosure, the network side device may be a base station. To-be-compressed data may be Session Initiation Protocol (SIP) signaling (e.g., first SIP signaling "invite") for a Voice over Long Term Evolution (VoLTE, an Internet Protocol (IP) Multimedia Subsystem (IMS)-based voice service), a Hyper Text Transfer Protocol (HTTP) webpage request, or a File Transfer Protocol (FTP) data packet.

The network side device may configure one dictionary for the UE and notify the UE to activate the dictionary for the UDC, and then the UE may perform the UDC using the configured dictionary in accordance with a notification from the network side device. Alternatively, the network side device may configure a plurality of dictionaries for the UE in advance and these dictionaries may be stored in the UE. The network side device may broadcast to the UE a dictionary identity to be used in a current cell through a broadcast message, or transmit the dictionary identity to the UE through an RRC message. Then, the UE may select a dictionary corresponding to the dictionary identity from the preconfigured plurality of dictionaries according to the received dictionary identity transmitted by the network side device, so as to perform the UDC.

When the network side device fails to configure the dictionary for the UE, the network side device may notify the UE to activate the dictionary for the UDC, and the UE may perform the UDC using a default dictionary stored in the UE.

In a possible embodiment of the present disclosure, the notifying, by the network side device, the dictionary for the UDC to the UE may include notifying, by the network side device, the UE to activate, deactivate or reset the dictionary for the UDC, or transmitting, by the network side device, the dictionary to the UE.

In a possible embodiment of the present disclosure, prior to configuring, by the network side device, the dictionary for the UDC for the UE, the dictionary configuration method may further include: acquiring, by the network side device, capability information of the UE, and the capability information may include an indication indicating whether the UE supports a UDC. The configuring, by the network side device for the UE, the dictionary for the UDC may include, when the UE supports the UDC, configuring, by the network side device for the UE, the dictionary for the UDC.

As a possible dictionary updating occasion, the UE may report an identifier of a cell or area where a dictionary have been acquired by the UE currently or were acquired previously to the network side device when the UE moves to a new Tracking Area (TA) and needs to initiate a TAU process. The network side device may issue a new dictionary to the UE; or the network side device may not issue a new dictionary to the UE and an original dictionary may be still used by the UE. Naturally, the dictionary may be checked or a new dictionary may be issued by the network side device to the UE when the UE enters a connected state each time.

The network side device may configure a TA list for the UE. When the UE enters a new cell and a Tracking Area Code (TAC) broadcast by the cell is not included in the TA list, the UE may initiate the TAU process. The UE may transmit an uplink RRC message to the network side device, and the uplink RRC message may include Network Access Server (NAS) layer TAU information and UDC information. The UDC information may include at least one of state information of the UDC supported by the UE, information of the dictionaries supported by the UE, and a dictionary identification number.

The state information of the UDC supported by the UE may be used to notify the network side device of a supporting state for the UE to support the UDC, the information of the dictionaries supported by the UE may be used by the network side device to acquire the dictionaries capable of being supported by the UE (i.e., the dictionaries capable of being configured for the UE), and the dictionary identification number may be used by the network side device to acquire dictionaries that have been currently stored in the UE.

In a possible embodiment of the present disclosure, the notifying, by the network side device, the UE to activate, deactivate or reset the dictionary for the UDC may include transmitting, by the network side device, an RRC connection reconfiguration message to the UE, and the RRC connection reconfiguration message may include at least one of dictionary activating or enabling indication and $M^{th}$ dictionary activating or enabling indication.

A dictionary to be activated or enabled may refer to a dictionary which is started to be used, and it may be a dictionary for the UDC notified by the network device to the UE. In the $M^{th}$ dictionary activating or enabling indication, an $M^{th}$ dictionary may be one of the dictionaries pre-stored in the UE, where M is a positive integer.

In a possible embodiment of the present disclosure, the RRC connection reconfiguration message may further include UDC activating indication which is used to indicate the UE to enable the UDC function.

In a possible embodiment of the present disclosure, subsequent to notifying, by the network side device, the dictionary for the UDC to the UE, the dictionary configuration method may further include transmitting, by the network side device, an RRC message to the UE, and the RRC message may include at least one of a dictionary deactivating or disabling indication, a dictionary resetting indication and UDC dictionary reloading indication. The dictionary deactivating or disabling indication may be used to indicate the UE to disable the dictionary for the UDC.

In a possible embodiment of the present disclosure, the RRC message may further include UDC deactivating indication which is used to indicate the UE to disable the UDC function.

In a possible embodiment of the present disclosure, the notifying, by the network side device, the UE to activate, deactivate or reset the dictionary for the UDC may include transmitting, by the network side device, PDCP PDU to the UE, and the PDCP PDU may carry at least one of a dictionary deactivating or disabling indication, dictionary activating or enabling indication, $M^{th}$ dictionary activating or enabling indication, a dictionary resetting indication, and UDC dictionary reloading indication.

In a possible embodiment of the present disclosure, the PDCP PDU may further include UDC activating indication which is used to indicate the UE to enable the UDC function.

In a possible embodiment of the present disclosure, the notifying, by the network side device, the UE to activate, deactivate or reset the dictionary for the UDC may include transmitting, by the network side device, a system broadcast message, the system broadcast message may include at least one of a dictionary deactivating or disabling indication for a bearer having a QCI of N, dictionary activating or enabling indication for the bearer having the QCI of N, a dictionary resetting indication for the bearer having the QCI of N, and $M^{th}$ dictionary activating indication for the bearer having the QCI of N, and an $M^{th}$ dictionary may be one of the dictionaries pre-stored in the UE, where N is a positive integer.

In a possible embodiment of the present disclosure, the system broadcast message may further include UDC activating indication for the bearer having the QCI of N, which is used to indicate the bearer having the QCI of N to enable the UDC function.

Figure 2:
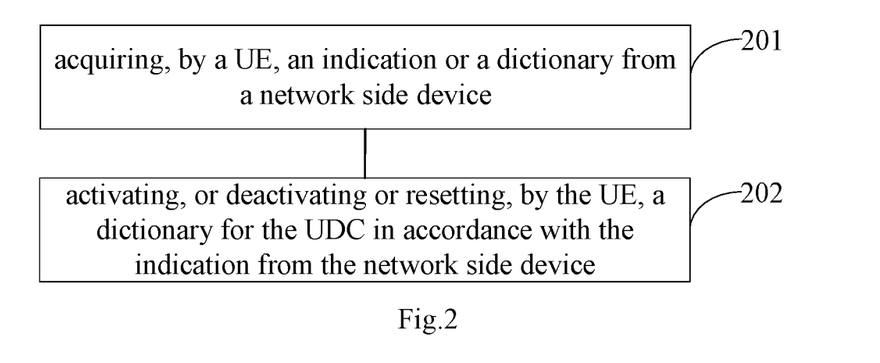
FIG. 2 is a flow chart of a dictionary configuration method for a UE according to some embodiments of the present disclosure.

The present disclosure further provides in some embodiments a dictionary configuration method for a UE which, as shown in FIG. 2, includes: Step 201 of acquiring, by the UE, an indication or a dictionary from a network side device; and Step 202 of activating, or deactivating or resetting, by the UE, a dictionary for the UDC in accordance with the indication from the network side device.

In the embodiments of the present disclosure, the network side device may dynamically configure for the UE the dictionary for the UDC, and notify the UE of the dictionary configured by the network side device. Then, the UE may activate, deactivate or reset the dictionary in accordance with a notification from the network side device, acquire the dictionary for the UDC configured by the network side device for the UE, and perform the UDC in accordance with the acquired dictionary configured by the network side device configured by the network side device.

In the embodiments of the present disclosure, the UE may perform the UDC using the dictionary dynamically configured by the network side device rather than a pre-stored static dictionary, so it is able for the network side device to configure a most appropriate dictionary for the UE.

In a possible embodiment of the present disclosure, prior to acquiring, by the UE, the indication or the dictionary from the network side device, the dictionary configuration method may further include, in a TAU process, reporting, by the UE, capability information of the UE to the network side device, and the capability information may include an indication indicating whether the UE supports a UDC. Then, the UE may activate, deactivate or reset the dictionary for the UDC in accordance with the indication from the network side device.

In a possible embodiment of the present disclosure, the acquiring, by the UE, the indication from the network side device may include receiving, by the UE, an RRC connection reconfiguration message transmitted by the network side device, the RRC connection reconfiguration message may include at least one of dictionary activating or enabling indication and $M^{th}$ dictionary activating or enabling indication, the $M^{th}$ dictionary is one of the dictionaries pre-stored in the UE, and M is a positive integer.

In a possible embodiment of the present disclosure, the dictionary configuration method may further include: when the RRC connection reconfiguration message includes the dictionary activating or enabling indication, storing, by the UE, a dictionary into a compression buffer, and compressing a first PDCP data packet in a current bearer using the dictionary; or when the RRC connection reconfiguration message includes the $IVI^{th}$ dictionary activating or enabling indication, storing, by the UE, an $M^{th}$ dictionary in the plurality of pre-stored dictionaries into the compression buffer, and compressing the first PDCP data packet in the current bearer using the $M^{th}$ dictionary. The compression buffer involved in the embodiments of the present disclosure may be a dedicated physical or virtual buffer allocated by the UE for a compression operation.

In a possible embodiment of the present disclosure, the RRC connection reconfiguration message may further include UDC activating indication which is used to indicate the UE to enable the UDC function.

In a possible embodiment of the present disclosure, the acquiring, by the UE, the indication from the network side device may include receiving, by the UE, an RRC message transmitted by the network side device, and the RRC message may include at least one of a dictionary deactivating or disabling indication, a dictionary resetting indication and UDC dictionary reloading indication.

In a possible embodiment of the present disclosure, the dictionary configuration method may further include: when the RRC message includes the dictionary deactivating or disabling indication, disabling, by the UE, a UDC function; or when the RRC message includes the dictionary resetting indication, emptying, by the UE, the compression buffer for UDC; or when the RRC message includes the UDC dictionary reloading indication, reloading, by the UE, the compression buffer for the UDC using the dictionary.

In a possible embodiment of the present disclosure, the RRC message may further include UDC deactivating indication which is used to indicate the UE to disable the UDC function.

In a possible embodiment of the present disclosure, the acquiring, by the UE, the indication from the network side device may include receiving, by the UE, PDCP PDU transmitted by the network side device, and activating or deactivating a dictionary for the UDC in accordance with the PDCP PDU. The PDCP PDU may carry at least one of a dictionary deactivating or disabling indication, dictionary activating or enabling indication, a dictionary resetting indication, and an identifier of a dictionary in a plurality of dictionaries pre-stored in the UE.

In a possible embodiment of the present disclosure, the acquiring, by the UE, the indication from the network side device may include receiving, by the UE, a system broadcast message transmitted by the network side device, and activating or deactivating, by the UE, the dictionary for the UDC in accordance with the system broadcast message. The system broadcast message may include at least one of a dictionary deactivating or disabling indication for a bearer having a QCI of N, dictionary activating or enabling indication for the bearer having the QCI of N, a dictionary resetting indication for the bearer having the QCI of N, and $M^{th}$ dictionary activating indication for the bearer having the QCI of N, and an $M^{th}$ dictionary may be one of the dictionaries stored in the UE, where N is a positive integer.

Figure 3A:
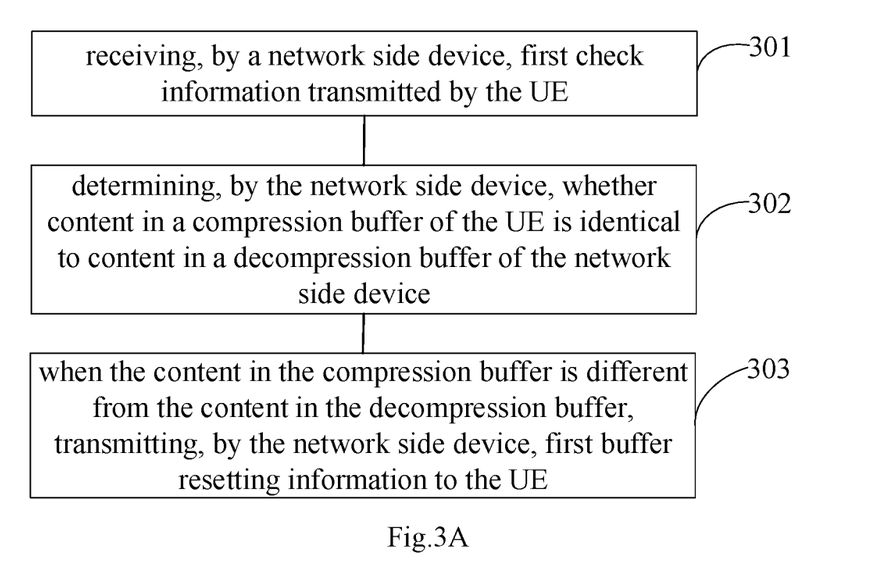
FIGS. 3A and 3B are flow charts of a buffer control method for the network side device according to some embodiments of the present disclosure.

The present disclosure further provides in some embodiments a buffer control method for a network side device, so as create uniform buffer content between the network side device and a UE. As shown in FIG. 3A, the buffer control method includes: Step 301 of receiving, by the network side device, first check information transmitted by the UE; Step 302 of determining, by the network side device, whether content in a compression buffer of the UE is identical to content in a decompression buffer of the network side device; and Step 303 of, when the content in the compression buffer is different from the content in the decompression buffer, transmitting, by the network side device, first buffer resetting information to the UE.

The first buffer resetting information may be used to indicate the UE to release or empty the compression buffer of the UE.

In Step 302, the network side device may determine whether the content in the compression buffer of the UE is identical to the content in the decompression buffer of the network side device in accordance with the first check information.

In a possible embodiment of the present disclosure, prior to Step 301 of receiving, by the network side device, the first check information transmitted by the UE, the buffer control method may further include acquiring, by the network side device, capability information of the UE, and the capability information may include an indication indicating whether the UE supports UDC. For example, the network side device may acquire the capability information of the UE from a core network device, or the UE may report the capability information of the UE to the network side device.

Figure 3B:
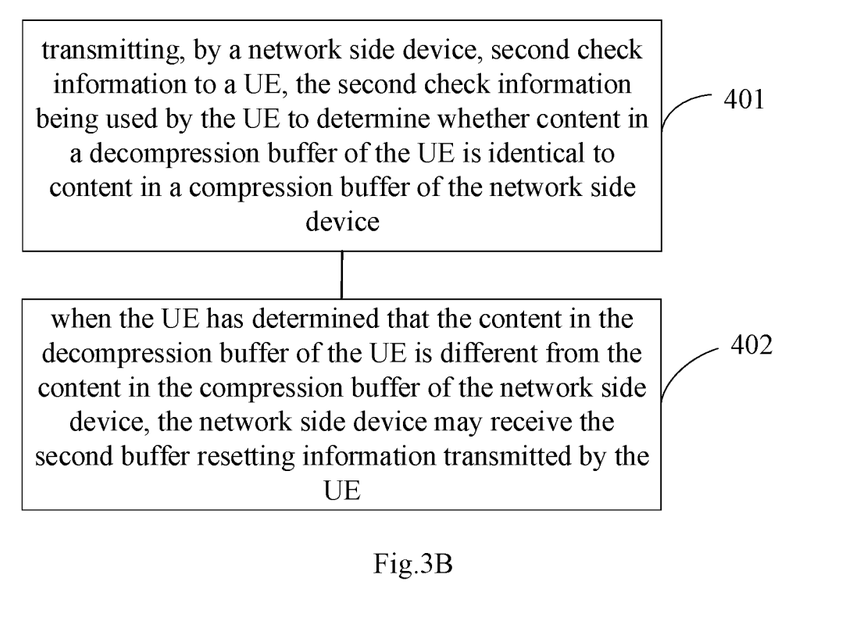

In a possible embodiment of the present disclosure, the network side device may also include a compression buffer and the UE may also include a decompression buffer. As shown in FIG. 3B, the buffer control method may further include: Step 401 of transmitting, by the network side device, second check information to the UE; and Step 402 of receiving, by the network side device, second buffer resetting information transmitted by the UE. The second buffer resetting information may be used to indicate the network side device to release or empty the compression buffer of the network side device.

In Step 401, the second check information may be used by the UE to determine whether the content in the decompression buffer of the UE is identical to the content in the compression buffer of the network side device.

In Step 402, when the UE has determined that the content in the decompression buffer of the UE is different from the content in the compression buffer of the network side device, the network side device may receive the second buffer resetting information transmitted by the UE.

In a possible embodiment of the present disclosure, the transmitting, by the network side device, the first buffer resetting information to the UE may include transmitting, by the network side device, the first buffer resetting information through PDCP PDU.

In a possible embodiment of the present disclosure, the receiving, by the network side device, the second buffer resetting information transmitted by the UE may include receiving, by the network side device, the second buffer resetting information transmitted by the UE through the PDCP PDU.

In a possible embodiment of the present disclosure, the buffer control method may further include, when the UE supports the UDC, transmitting, by the network side device, at least one of UDC activating indication, dictionary activating or enabling indication, and $M^{th}$ dictionary activating or enabling indication to the UE, where M is positive integer greater than 1.

In a possible embodiment of the present disclosure, the buffer control method may further include, when the UE is in a connected state, transmitting, by the network side device, UDC configuration information to the UE, and the UDC configuration information may include one or more of UDC deactivating indication, UDC dictionary resetting indication and UDC dictionary reloading indication.

It should be appreciated that, in the buffer control method for the network side device, Steps 301 to 303 may be performed before, after or simultaneously with Step 401 to 402.

Figure 4A:
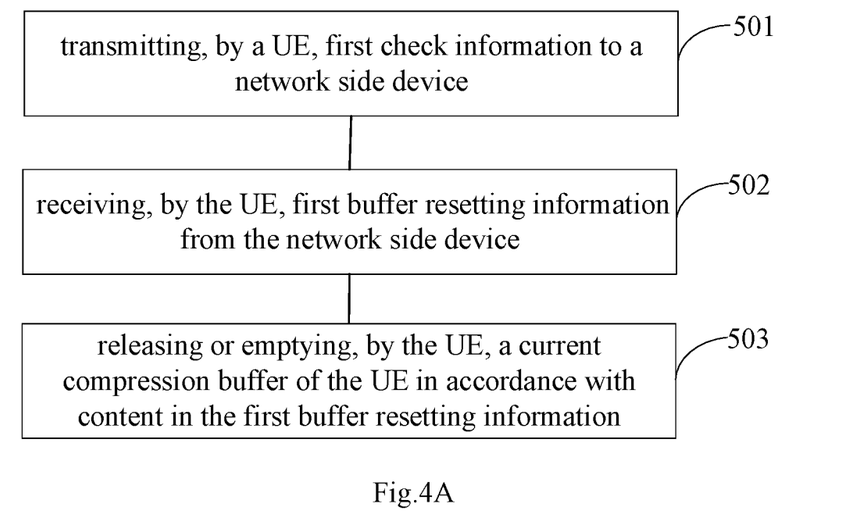
FIGS. 4A and 4B are flow charts of a buffer control method for the UE according to some embodiments of the present disclosure.

The present disclosure further provides in some embodiments a buffer control method for a UE, so as to create uniform buffer content between a network side device and the UE. As shown in FIG. 4A, the buffer control method includes: Step 501 of transmitting, by the UE, first check information to the network side device; Step 502 of receiving, by the UE, the first buffer resetting information from the network side device; and Step 503 of releasing or emptying, by the UE, a current compression buffer of the UE in accordance with content in the first buffer resetting information.

In Step 501, the first check information may be used by the network side device to determine whether content in a compression buffer of the UE is identical to content in a decompression buffer of the network side device.

In Step 502, when the network side device has determined that the content in the compression buffer of the UE is different from the content in the decompression buffer of the network side device, the network side device may transmit the first buffer resetting information to the UE.

In a possible embodiment of the present disclosure, the buffer control method may further include receiving, by the UE, at least one of UDC activating indication, dictionary activating or enabling indication, and $M^{th}$ dictionary activating or enabling indication from the network side device, where M is positive integer greater than 1.

In a possible embodiment of the present disclosure, the buffer control method may further include: when the UE receives the UDC activating indication, comparing, by the UE, each PDCP data packet with content in the compression buffer of the UE, and replacing the original PDCP data packet with an identifier of the compression buffer, so as to achieve a UDC; when the UE receives the dictionary activating or enabling indication, storing, by the UE, a dictionary into the compression buffer, compressing a first PDCP data packet in a current bearer using a dictionary in the compression buffer, continuously updating the compression buffer in accordance with transmitted data packets, and continuing to compress a subsequent data packet using the updated compression buffer; and when the UE receives the $M^{th}$ dictionary activating or enabling indication, storing, by the UE, an $M^{th}$ dictionary in dictionaries previously received and configured by the network side device into the compression buffer, compressing the first PDCP data packet in the current bearer using the $M^{th}$ dictionary, continuously updating the compression buffer in accordance with the transmitted data packets, and continuing to compress the subsequent data packet using the updated compression buffer, wherein the content of the dictionary is to be out of the compression buffer.

In a possible embodiment of the present disclosure, the buffer control method may further include, when the UE is in a connected state, receiving, by the UE, UDC configuration information from the network side device, and the UDC configuration information may include one or more of UDC deactivating indication, UDC dictionary resetting indication and UDC dictionary reloading indication.

In a possible embodiment of the present disclosure, the buffer control method may further include: when the UE receives the UDC deactivating indication, disabling, by the UE, the UDC, and not performing the UDC on a subsequent PDCP data packet; when the UE receives the UDC dictionary resetting indication, emptying, by the UE, the compression buffer; and when the UE receives the UDC dictionary reloading indication, reloading, by the UE, dictionaries into the compression buffer.

Figure 4B:
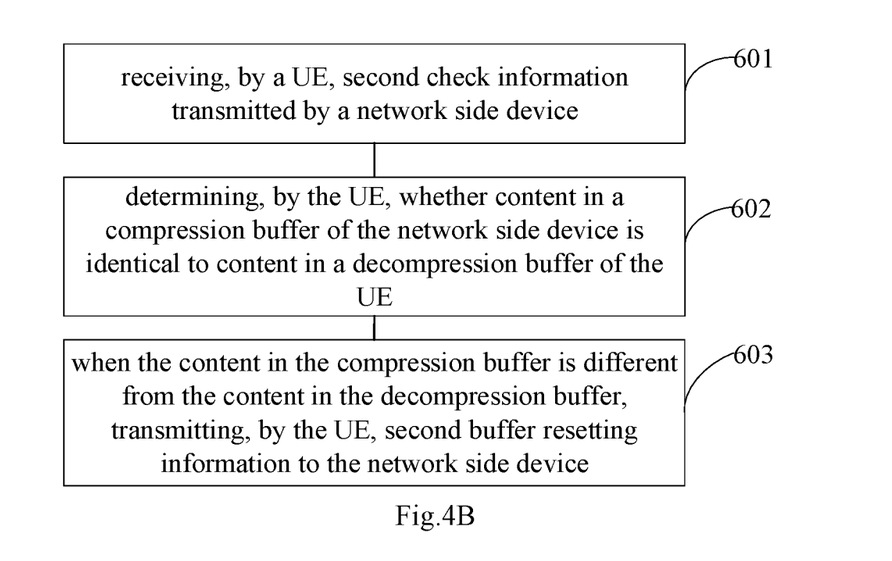

In a possible embodiment of the present disclosure, the network side device may also include a compression buffer and the UE may also include a decompression buffer. As shown in FIG. 4B, the buffer control method for the UE may further include: Step 601 of receiving, by the UE, second check information transmitted by the network side device, wherein the second check information is used by the UE to determine whether the content in the compression buffer of the network side device is identical to the content in the decompression buffer of the UE; Step 602 of determining, by the UE, whether content in a compression buffer of the network side device is identical to content in a decompression buffer of the UE; and Step 603 of when the content in the compression buffer is different from the content in the decompression buffer, transmitting, by the UE, second buffer resetting information to the network side device.

In Step 602, the UE may determine whether the content in the compression buffer of the network side device is identical to the content in the decompression buffer of the UE in accordance with the second check information.

The second buffer resetting information may be used to indicate the network side device to release or empty the compression buffer of the network side device.

The transmitting, by the UE, the second buffer resetting information to the network side device may include transmitting, by the UE, the second buffer resetting information through PDCP PDU.

It should be appreciated that, in the buffer control method for the UE, Steps 501 to 503 may be performed before, after or simultaneously with Step 601 to 603.

The technical solutions in the present disclosure will be described hereinafter in conjunction with the following embodiments.

First Embodiment

In this embodiment, the dictionary for the UDC may be activated and deactivated through the RRC message.

When the UE needs to initiate a service, the UE may initiate a random access process, and an evolved Node B (eNB) may configure and establish a dedicated bearer, e.g., an SRB1 bearer or a QCI5 bearer, for the UE. The eNB (base station) may acquire capability information of the UE from a Mobility Management Entity (MME), and the capability information may include an indication indicating whether the UE supports the UDC. When the UE supports the UDC, the eNB may transmit the RRC connection reconfiguration message to the UE, and the RRC connection reconfiguration message may include at least one of the UDC activating indication, the dictionary activating or enabling indication and the $M^{th}$ dictionary activating or enabling indication. For example, the RRC connection reconfiguration message may include the UDC activating indication and the dictionary activating or enabling indication, or include the UDC activating indication and the $M^{th}$ dictionary activating or enabling indication. In a possible embodiment of the present disclosure, the dictionary activating or enabling indication may be used to indicate that a blank dictionary is to be enabled.

When the UE receives the UDC activating indication, the UE may enable the UDC function for a current bearer, i.e., compare each PDCP data packet with the compression buffer of the UE and replace the original PDCP data packet with an identifier of the compression buffer, so as to implement the UDC.

The UE may transmit check information to the eNB, and the check information may be acquired through data buffered in the compression buffer of the UE (e.g., a check sum acquired through checking a part of data from the data buffered in the compression buffer). The check information may be used by a decompressor of the eNB to determine whether the content in the compression buffer of the UE is identical to the content in the decompression buffer of the eNB, so as to present a decompression failure when the two are different from each other. When the two are different from each other, the eNB may transmit buffer resetting information to the UE, so as to enable the content in the compression buffer of the UE to be consistent with the content in the decompression buffer of the eNB. The buffer resetting information may be information indicating the UE to release or empty the current compression buffer of the UE. When the UE receives the buffer resetting information, the UE may release or empty the current compression buffer of the UE in accordance with content in the buffer resetting information. The buffer resetting information may be transmitted through the PDCP PDU.

When the UE receives the dictionary activating or enabling indication, the UE may store the dictionary into the compression buffer, and compress a first PDCP data packet in the current bearer using the dictionary in the compression buffer. The compression buffer may be continuously updated in accordance with transmitted data packets, and a subsequent data packet may be continued to be compressed by using the updated compression buffer.

When the UE receives the $M^{th}$ dictionary activating or enabling indication, the UE may store the $M^{th}$ dictionary in the dictionaries configured by and previously received from the eNB into the compression buffer, and compress a first PDCP data packet in the current bearer using the $M^{th}$ dictionary. The compression buffer may be continuously updated in accordance with transmitted data packets, and a subsequent data packet may be continued to be compressed by using the updated compression buffer.

When the UE is in a connected state, the eNB may transmit the UDC configuration information to the UE, and the UDC configuration information may include one or more of the UDC deactivating indication, the UDC dictionary resetting indication and the UDC dictionary reloading indication.

When the UE receives the UDC deactivating indication, the UE may disable the UDC and the UDC may not be performed on the subsequent PDCP data packet.

When the UE receives the UDC dictionary resetting indication, the UE may empty the compression buffer.

When the UE receives the UDC dictionary reloading indication, the UE may reload the compression buffer for the UDC using the dictionaries.

Second Embodiment

In this embodiment, the network side device may activate and deactivate the UDC dictionary through the PDCP PDU.

Figure 5A:
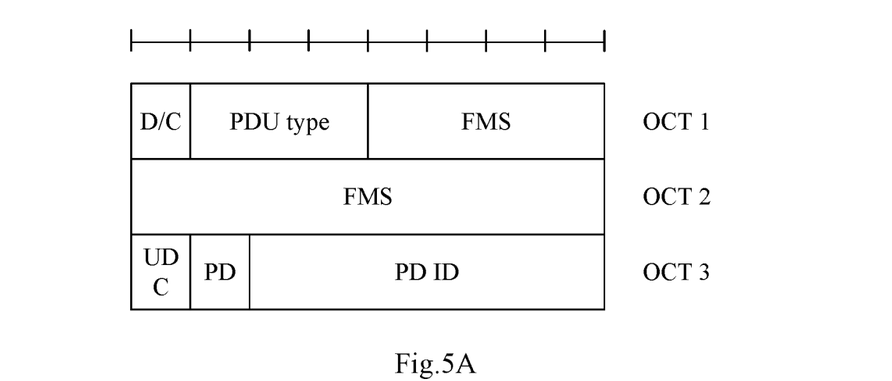
FIGS. 5A-5E are schematic views showing PDCP PDU according to some embodiments of the present disclosure.

The eNB may transmit the PDCP PDU to the UE. As shown in FIG. 5A, the PDCP PDU may include one or more of the following fields.

(1) A UDC field indicating whether the UDC is to be activated or deactivated, where 1 represents that the UDC is to be activated, and 0 represents that the UDC is to be disabled, i.e., the UDC is to be deactivated. When the UE receives the PDCP PDU, the UE may enable or disable the UDC in accordance with a value of the UDC field.

(2) PD field, which indicates a Predefined Dictionary (PD), where 1 represents that a dictionary is to be loaded and 0 represents that the dictionary is to be emptied. When the UE receives the PDCP PDU, and a value of the PD field is 1, the UE may load the dictionary and compress a first PDCP data packet using the compression buffer with the dictionary. When the value of the PD field is 0, the UE may reset, i.e., empty, the compression buffer.

(3) PD ID field, which indicates a predefined dictionary identity (ID). More than one bit may be used to indicate the dictionary ID that the eNB requires the UE to use. When the UE receives the PDCP PDU, the UE may acquire the dictionary in accordance with the dictionary identity indicated in the PD ID field, store the dictionary into the compression buffer, and compress the first PDCP data packet using the compression buffer with the dictionary. When the PD ID field is blank or empty and PD=1, a default dictionary may be stored, and when PD=0, no dictionary may be stored and the compression buffer may be emptied.

The eNB may transmit the PDCP PDU to the UE so as to disable the UDC, i.e., set the UDC field as 0, or modify the currently-used dictionary, i.e., fill a dictionary ID of the new dictionary to be activated in the PD ID field.

Figure 5B:
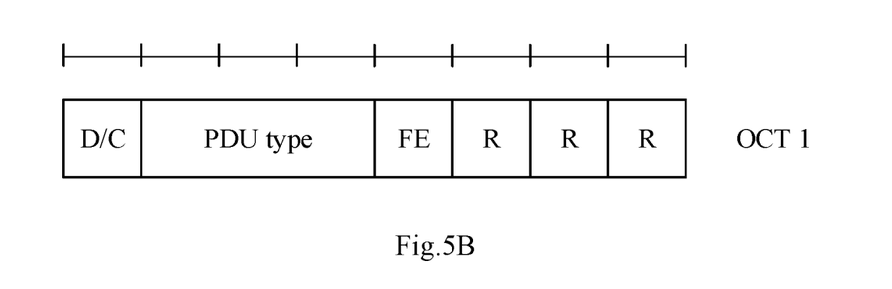

FIG. 5B shows a PDCP control PDU carrying a UDC feedback message, where FE represents whether the checksum is erroneous, 0 represents that the checksum is errorless, and 1 represents that the checksum is erroneous.

Figure 5C:
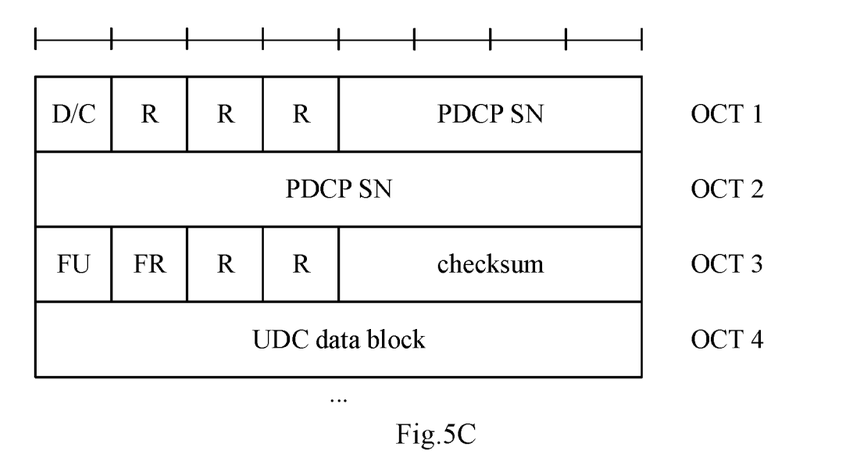

FIG. 5C shows a PDCP data PDU of a 12-bit Sequence Number (SN), where "checksum" represents checksum information, FU represents whether UDC is to be used, and FR represents whether the compression buffer is to be reset.

Figure 5D:
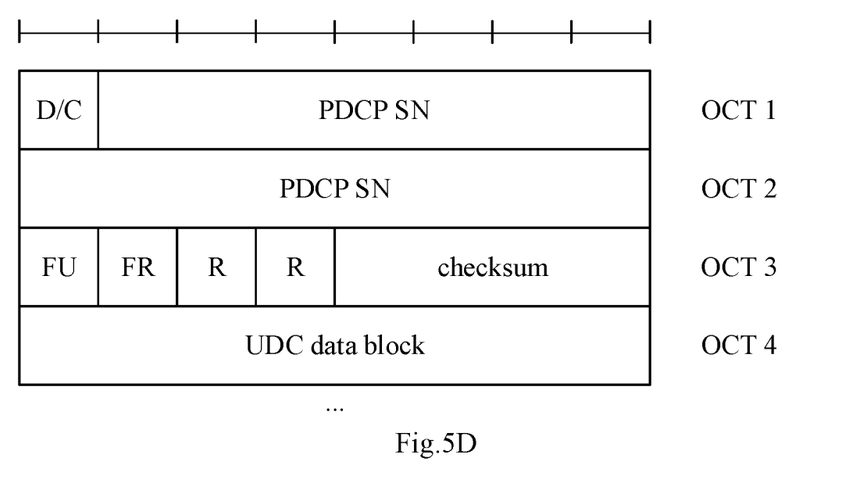
Figure 5E:
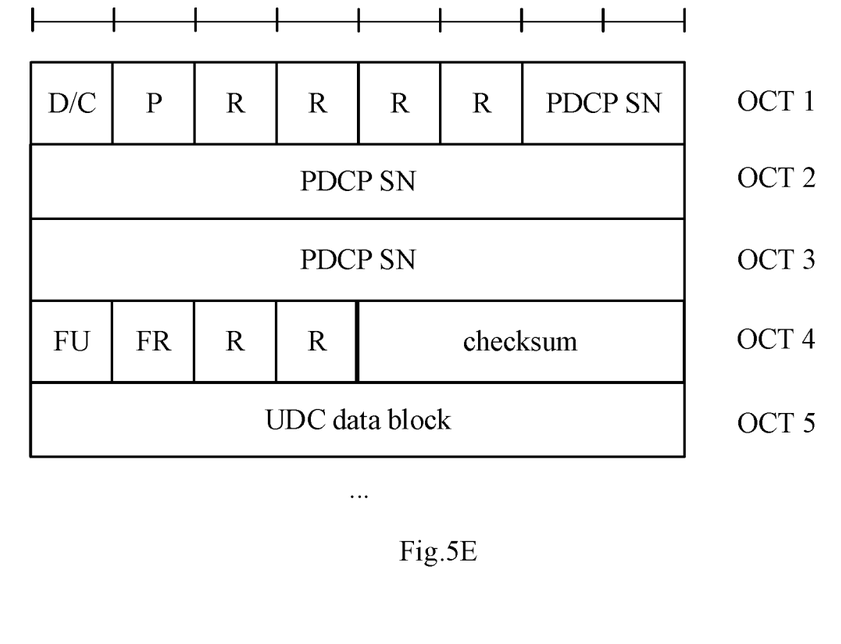

FIG. 5D shows a PDCP data PDU of a 15-bit SN, where "checksum" represents checksum information, FU represents whether the UDC is to be used, and FR represents whether the compression buffer is to be reset.

FIG. 5D shows a PDCP data PDU of an 18-bit SN, where "checksum" represents checksum information, FU represents whether the UDC is to be used, and FR represents whether the compression buffer is to be reset.

Third Embodiment

In this embodiment, the network side device may activate or deactivate the dictionary for the UDC through a broadcast message.

Each Data Resource Bearer (DRB) corresponds to a QCI. For example, for a default bearer of an Internet service, QCI=9; for a default bearer of a VoLTE service, QCI=5; for a dedicated bearer of the VoLTE service, QCI=1, and for a dedicated bearer of a Video over LTE (ViLTE) service, QCI=2. The UDC may be performed with respect to a certain bearer, e.g., merely a bearer with QCI=5, rather than a bearer with QCI=9, may be compressed. In addition, the bearer with QCI=5 may be compressed using the $M^{th}$ dictionary, and a bearer with QCI=1 may be compressed using a $Q^{th}$ dictionary.

The eNB may broadcast one or more pieces of the following information through the system message.

(1) Information indicating that the UDC is to be activated and/or deactivated for the bearer with QCI=N. In other words, when the UE is in the connected state, the UDC may be activated for the bearer with the QCI=N. In the case that the UE receives this information, when the UE enters the connected state and establishes the bearer with QCI=N, the UE may activate the UDC for the bearer, or deactivate the UDC for the bearer with the QCI=N, i.e., the UE may disable the UDC for the bearer with the QCI=N.

(2) Information indicating that the dictionary is to be activated for the bearer with QCI=N. In other words, when the UE is in the connected state, the UE may activate the dictionary for the bearer with QCI=N. In the case that the UE receives this information, when the UE enters the connected state and establishes the bearer with QCI=N, the UE may store the dictionary into the compression buffer, and compress the first PDCP data pack using the compression buffer with the dictionary. When the first information indicates that the UDC needs to be activated for the bearer and the second information does not indicates that the dictionary is to be activated for the bearer, no dictionary may be used for the bearer and an initial buffer may be blank.

(3) Information indicating that the $M^{th}$ dictionary is to be activated for the bearer with QCI=N. In other words, when the UE is in the connected state, the $M^{th}$ dictionary may be activated for the bearer with QCI=N. In the case that the UE receives this information, when the UE enters the connected state and establishes the bearer with QCI=N, the UE may store the $M^{th}$ dictionary into the compression buffer, and compress the first PDCP data packet using the compression buffer with the dictionary. When the system message includes the above-mentioned second information rather than this information, the UE may store the default dictionary into the compression buffer.

Fourth Embodiment

In the case that the UE initiates a TAU process, the UE may report to the network side device that the UE has a UDC capability and/or a dictionary pre-storing capability. The network side device may issue an appropriate dictionary for the UE in a current region. To be specific, the base station may issue the appropriate dictionary through the RRC connection reconfiguration message in the TAU process, or the MME may issue the appropriate dictionary to the UE through an NAS message. One or more dictionaries may be configured for the UE. In addition, when the UE leaves the factory, a set of default dictionaries may be installed in the UE in advance.

When one dictionary is configured by the network side device for the UE and the UE is in the connected state again, the UE may perform the data compression using the configured dictionary. When no dictionary is configured by the network side device for the UE, the UE may perform the data compression using the default dictionary.

When more than one dictionary is configured by the network side device for the UE, the network side device may number each dictionary, i.e., a first dictionary, a second dictionary, a third dictionary, and so on. The plurality of dictionaries may be stored in the UE. The network side device may transmit the dictionary ID, e.g., number two, to the UE through the system broadcast message, and the UE in a current cell may perform the data compression using the second dictionary corresponding to the dictionary ID. The network side device may also transmit the dictionary ID to the UE through the RRC message, and the UE may perform the data compression using the corresponding dictionary.

When the UE in an idle state initiates a connection establishment request, the network side device may transmit an RRC reconfiguration message to the UE, and the RRC reconfiguration message may include a UDC indication. The UE may perform the compression on a first message transmitted on the bearer using the configured dictionary.

When the UE enters another TA, the UE may report to the network side device an identifier of a cell or area where the dictionary indication has been acquired by the UE currently and/or where the dictionary ID has been acquired and/or where the dictionary has been acquired. When the network side device issues a new dictionary to the UE, the UE may discard the previously-stored dictionary, and when the network side device fails to issue the new dictionary to the UE, the UE may continue to use the original dictionary.

Fifth Embodiment

In this embodiment, the network side device may issue the dictionary to the UE through RRC signaling.

The UE may initiate a random access process and enter the connected state. The network side device may establish a QCI5 bearer for the UE through the RRC message, and transmit the dictionary to the UE through the RRC message. When transmitting the message "invite" of the VoLTE service on the QCI5 bearer, the UE may compress the message "invite" using the dictionary, and the network side device may decompress the data packet using the dictionary.

In this embodiment, when the UE enters the connected state each time, the network side device may transmit the dictionary to the UE through the RRC message, and this dictionary may be merely used in a current connection process. When the UE enters the connected state again, the network side device may transmit a new dictionary to the UE.

Figure 6:
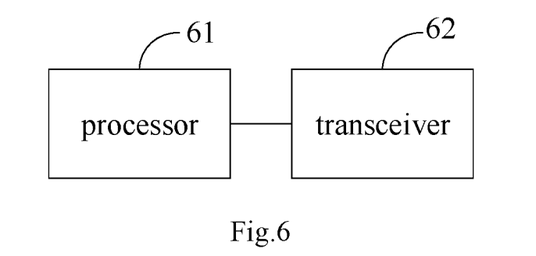
FIG. 6 is a schematic view showing the network side device according to some embodiments of the present disclosure.

The present disclosure further provides in some embodiments a network side device which, as shown in FIG. 6, includes a processor 61 and a transceiver 62. The transceiver 62 is configured to notify a UE to activate, deactivate or reset a dictionary for UDC.

According to the embodiments of the present disclosure, the network side device may dynamically configure for the UE the dictionary for the UDC, and notify the UE to activate, deactivate, or reset the dictionary. Then, the UE may acquire the dictionary for the UDC configured by the network side device for the UE, and perform the UDC in accordance with the acquired dictionary configured by the networks side device. The UE may perform the UDC using the dictionary dynamically configured by the network side device rather than a pre-stored static dictionary, so it is able for the network side device to configure a most appropriate dictionary for the UE.

In a possible embodiment of the present disclosure, the processor 61 is further configured to: acquire capability information of the UE, the capability information including an indication indicating whether the UE supports an UDC; and when the UE supports the UDC, configure for the UE the dictionary for the UDC.

In a possible embodiment of the present disclosure, the transceiver 62 is specifically configured to transmit an RRC connection reconfiguration message to the UE, the RRC connection reconfiguration message may include at least one of dictionary activating or enabling indication and $M^{th}$ dictionary activating or enabling indication, and an $M^{th}$ dictionary may be one of the dictionaries pre-stored in the UE.

In a possible embodiment of the present disclosure, the transceiver 62 is further configured to transmit an RRC message to the UE, and the RRC message may include at least one of a dictionary deactivating or disabling indication, a dictionary resetting indication and UDC dictionary reloading indication.

In a possible embodiment of the present disclosure, the transceiver 62 is specifically configured to transmit PDCP PDU to the UE, and the PDCP PDU may carry at least one of a dictionary deactivating or disabling indication, dictionary activating or enabling indication, a dictionary resetting indication, and an identifier of one of the dictionaries pre-stored in the UE.

In a possible embodiment of the present disclosure, the transceiver 62 is specifically configured to transmit a system broadcast message, the system broadcast message may include at least one of a dictionary deactivating or disabling indication for a bearer having a QCI of N, dictionary activating or enabling indication for the bearer having the QCI of N, a dictionary resetting indication for the bearer having the QCI of N, and $M^{th}$ dictionary activating indication for the bearer having the QCI of N, and an $M^{th}$ dictionary may be one of a plurality of dictionaries pre-stored in the UE.

Figure 7:
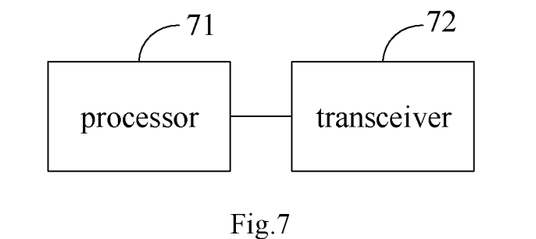
FIG. 7 is a schematic view showing the UE according to some embodiments of the present disclosure.

The present disclosure further provides in some embodiments a UE which, as shown in FIG. 7, includes a processor 71 and a transceiver 72. The processor 71 is configured to activate, deactivate or reset a dictionary for UDC in accordance with an indication from a network side device.

According to the embodiments of the present disclosure, the network side device may dynamically configure for the UE the dictionary for the UDC, and notify the UE to activate, deactivate, or reset the dictionary. Then, the UE may acquire the dictionary for the UDC configured by the network side device for the UE, and perform the UDC in accordance with the acquired dictionary configured by the networks side device. The UE may perform the UDC using the dictionary dynamically configured by the network side device rather than a pre-stored static dictionary, so it is able for the network side device to configure a most appropriate dictionary for the UE.

In a possible embodiment of the present disclosure, the transceiver 72 is further configured to: report capability information of the UE to the network side device, the capability information including an indication indicating whether the UE supports a UDC; and acquiring a dictionary for UDC configured by the network side device for the UE.

In a possible embodiment of the present disclosure, the transceiver 72 is specifically configured to receive an RRC connection reconfiguration message from the network side device, the RRC connection reconfiguration message may include at least one of dictionary activating or enabling indication and $M^{th}$ dictionary activating or enabling indication, and an $M^{th}$ dictionary may be one of the dictionaries pre-stored in the UE.

In a possible embodiment of the present disclosure, the processor is further configured to: when the RRC connection reconfiguration message includes the dictionary activating or enabling indication, store a dictionary into a compression buffer, and compress a first PDCP data packet in a current bearer using the dictionary; or when the RRC connection reconfiguration message includes the $M^{th}$ dictionary activating or enabling indication, store the $M^{th}$ dictionary in the plurality of pre-stored dictionaries into the compression buffer, and compress the first PDCP data packet in the current bearer using the $M^{th}$ dictionary.

In a possible embodiment of the present disclosure, the transceiver 72 is further configured to receive an RRC message from the network side device, and the RRC message may include at least one of a dictionary deactivating or disabling indication, a dictionary resetting indication and UDC dictionary reloading indication.

The processor is further configured to: when the RRC message includes the dictionary deactivating or disabling indication, disable the UDC function; or when the RRC message includes the dictionary resetting indication, empty the compression buffer for UDC; or when the RRC message includes the UDC dictionary reloading indication, reload the compression buffer for the UDC using the dictionary.

In a possible embodiment of the present disclosure, the transceiver 72 is specifically configured to receive PDCP PDU from the network side device, and activate or deactivate a dictionary for the UDC in accordance with the PDCP PDU. The PDCP PDU may carry at least one of a dictionary deactivating or disabling indication, dictionary activating or enabling indication, a dictionary resetting indication, and an identifier of a dictionary in a plurality of dictionaries pre-stored in the UE.

In a possible embodiment of the present disclosure, the transceiver 72 is specifically configured to receive a system broadcast message from the network side device, and activate or deactivate the dictionary for the UDC of a bearer in accordance with the system broadcast message. The system broadcast message may include at least one of a dictionary deactivating or disabling indication for a bearer having a QCI of N, dictionary activating or enabling indication for the bearer having the QCI of N, a dictionary resetting indication for the bearer having the QCI of N, and $M^{th}$ dictionary activating indication for the bearer having the QCI of N, and an $M^{th}$ dictionary may be one of the dictionaries pre-stored in the UE.

The present disclosure further provides in some embodiments a network side device, which includes a memory, a processor, and a computer program stored in the memory and configured to be executed by a processor. The processor is configured to execute the computer program so as to implement the steps of the above-mentioned buffer control method. All technical details and effects of the network side device may refer to those of the buffer control method for the network side device, and thus will not be particularly defined herein.

The present disclosure further provides in some embodiments a UE, which includes a memory, a processor, and a computer program stored in the memory and configured to be executed by a processor. The processor is configured to execute the computer program so as to implement the steps of the above-mentioned buffer control method. All technical details and effects of the UE may refer to those of the buffer control method for the UE, and thus will not be particularly defined herein.

The present disclosure further provides in some embodiments a computer-readable storage medium storing therein a computer program. The computer program is executed by a processor so as to implement the steps of the above-mentioned dictionary configuration methods or the steps of the above-mentioned buffer control methods.

The computer-readable storage medium may include volatile or nonvolatile, mobile or immobile storage medium capable of storing therein information using any method or technique. The information may be a computer-readable instruction, a data structure, a program module or other data. The computer-readable storage medium may include, but not limited to, a Random Access Memory (e.g., Phase change Random Access Memory (PRAM), Static Random Access Memory (SRAM) or Dynamic Random Access Memory (DRAM)), a Read Only Memory (ROM), an Electrically Erasable Programmable Read Only Memory (EE-PROM), a flash memory, a Compact Disc Read Only Memory (CD-ROM) or a Digital Versatile Disc (DVD), a magnetic storage device (e.g., a cassette magnetic tape or a magnetic disk), or any other non-transmission medium capable of storing therein information which can be accessed by a computing device. As defined in the present disclosure, the computer-readable storage medium may not include any transitory media, e.g., modulated data signal or carrier.

The above embodiments are for illustrative purposes only. It should be appreciated that, a person skilled in the art may make further modifications and improvements without departing from the principle of the present disclosure, and these modifications and improvements shall also fall within the scope of the present disclosure.

What is claimed is:

1. A buffer control method for a User Equipment (UE), comprising:
   transmitting, by the UE, first check information to a network side device, wherein the first check information is acquired based on a sum of a part of buffered data;
   receiving, by the UE, first buffer resetting information from the network side device;
   releasing or emptying a current compression buffer of the UE in accordance with content in the first buffer resetting information; and
   when the UE receives a dictionary activating or enabling indication,
      storing, by the UE, a dictionary into the compression buffer;
      compressing, by the UE through Uplink Data Compression (UDC), an uncompressed data packet to obtain a compressed data packet; and
      transmitting, by the UE, the compressed data packet,
   wherein the compression buffer is continuously updated by the UE in accordance with the uncompressed data packet which is compressed by the UDC and transmitted;
   the buffer control method further comprises:
   receiving, by the UE, at least one of UDC activating indication and $M^{th}$ dictionary activating or enabling indication from the network side device, where M is positive integer greater than 1;
   when the UE receives the UDC activating indication, comparing, by the UE, each PDCP data packet with content in the compression buffer of the UE, and replacing, by the UE, the original PDCP data packet with an identifier of the compression buffer, to achieve UDC.

2. The buffer control method according to claim 1, further comprising:
   continuing to compress, by the UE, a subsequent data packet using the updated compression buffer.

3. The buffer control method according to claim 1, further comprising:
   when the UE receives the $M^{th}$ dictionary activating or enabling indication, storing, by the UE, an $M^{th}$ dictionary in previously received dictionaries into the compression buffer, compressing, by the UE, the first PDCP data packet in the current bearer using the $M^{th}$ dictionary, continuously updating, by the UE, the compression buffer in accordance with the transmitted data packet, and continuing to compress, by the UE, the subsequent data packet using the updated compression buffer, wherein the previously received dictionaries are configured by the network side device.

4. The buffer control method according to claim 1, further comprising:
   when the UE is in a connected state, receiving, by the UE, UDC configuration information from the network side device,
   wherein the UDC configuration information comprises one or more of UDC deactivating indication, UDC dictionary resetting indication and UDC dictionary reloading indication.

5. The buffer control method according to claim 4, further comprising:
   when the UE receives the UDC deactivating indication, disabling, by the UE, the UDC, and not performing the UDC on a subsequent PDCP data packet;
   when the UE receives the UDC dictionary resetting indication, emptying, by the UE, the compression buffer; and
   when the UE receives the UDC dictionary reloading indication, reloading, by the UE, a dictionary into the compression buffer.

6. The buffer control method according to claim 1, further comprising:
   receiving, by the UE, second check information transmitted by the network side device;

determining, by the UE, whether content in a decompression buffer of the UE is identical to content in a compression buffer of the network side device; and when the content in the compression buffer of the network side device is different from the content in the decompression buffer of the UE, transmitting, by the UE, second buffer resetting information to the network side device.

7. The buffer control method according to claim 6, wherein the second buffer resetting information is used to indicate the network side device to release or empty the compression buffer of the network side device.

8. A UE, comprising a processor, a transceiver and a compression buffer, wherein the transceiver is configured to transmit first check information to a network side device, and receive first buffer resetting information from the network side device, wherein the first check information is acquired based on a sum of a part of buffered data; and the processor is configured to:
release or empty the compression buffer of the UE in accordance with content in the first buffer resetting information; and
when the transceiver receives a dictionary activating or enabling indication,
store a dictionary into the compression buffer;
compress an uncompressed data packet through UDC to obtain a compressed data packet; and
transmit the compressed data packet,
wherein the compression buffer is continuously updated by the processor in accordance with the uncompressed data packet which is compressed by the UDC and transmitted;

the transceiver is further configured to receive at least one of UDC activating indication and $M^{th}$ dictionary activating or enabling indication from the network side device, where M is positive integer greater than 1;

the processor is further configured to:
when the transceiver receives the UDC activating indication, compare each PDCP data packet with content in the compression buffer of the UE, and replace the original PDCP data packet with an identifier of the compression buffer, to achieve UDC.

9. The UE according to claim 8, wherein the processor is further configured to continue to compress a subsequent data packet using the updated compression buffer.

10. The UE according to claim 8, wherein the processor is further configured to:
when the transceiver receives the $M^{th}$ dictionary activating or enabling indication, store an $M^{th}$ dictionary in previously received dictionaries into the compression buffer, compress the first PDCP data packet in the current bearer using the $M^{th}$ dictionary, continuously update the compression buffer in accordance with the transmitted data packet, and continue to compress the subsequent data packet using the updated compression buffer, wherein the previously received dictionaries are configured by the network side device.

11. The UE according to claim 8, wherein the transceiver is further configured to, when the UE is in a connected state, receive UDC configuration information from the network side device,
wherein the UDC configuration information comprises one or more of UDC deactivating indication, UDC dictionary resetting indication and UDC dictionary reloading indication.

12. The UE according to claim 11, wherein the processor is further configured to:
when the transceiver receives the UDC deactivating indication, disable the UDC, and not perform the UDC on a subsequent PDCP data packet;
when the transceiver receives the UDC dictionary resetting indication, empty the compression buffer; and
when the transceiver receives the UDC dictionary reloading indication, reload a dictionary into the compression buffer.

13. The UE according to claim 8, further comprising a decompression buffer, wherein
the transceiver is further configured to receive second check information transmitted by the network side device; and
the processor is further configured to determine whether content in the decompression buffer of the UE is identical to content in a compression buffer of the network side device, and when the content in the decompression buffer of the UE is different from the content in the compression buffer of the network side device, transmit second buffer resetting information to the network side device through the transceiver.

14. The UE according to claim 13, wherein the second buffer resetting information is used to indicate the network side device to release or empty the compression buffer of the network side device.

15. A non-volatile computer-readable storage medium storing therein a computer program, wherein the computer program is used to be executed by a processor to:
transmit first check information to a network side device, wherein the first check information is acquired based on a sum of a part of buffered data;
receive first buffer resetting information from the network side device;
release or empty a current compression buffer of the UE in accordance with content in the first buffer resetting information; and
when receiving a dictionary activating or enabling indication,
store a dictionary into the compression buffer;
compress an uncompressed data packet through UDC to obtain a compressed data packet; and
transmit the compressed data packet,
wherein the compression buffer is continuously updated by the processor in accordance with the uncompressed data packet which is compressed by the UDC and transmitted;

the computer program is further used to be executed by the processor to:
receive at least one of UDC activating indication and $M^{th}$ dictionary activating or enabling indication from the network side device, where M is positive integer greater than 1;
when the UE receives the UDC activating indication, compare each PDCP data packet with content in the compression buffer of the UE, and replace the original PDCP data packet with an identifier of the compression buffer, to achieve UDC.

16. The non-volatile computer-readable storage medium according to claim 15, wherein the computer program is further used to be executed by the processor to:
continue to compress a subsequent data packet using the updated compression buffer.

17. The non-volatile computer-readable storage medium according to claim 15, wherein the computer program is further used to be executed by the processor to:

when the UE receives the $M^{th}$ dictionary activating or enabling indication, store an $M^{th}$ dictionary in previously received dictionaries into the compression buffer, compress the first PDCP data packet in the current bearer using the $M^{th}$ dictionary, continuously update the compression buffer in accordance with the transmitted data packet, and continue to compress the subsequent data packet using the updated compression buffer, wherein the previously received dictionaries are configured by the network side device.

* * * * *